United States Patent
Cho

(10) Patent No.: US 11,372,325 B2
(45) Date of Patent: Jun. 28, 2022

(54) MASK AND MANUFACTURING METHOD THEREOF

(71) Applicants: HKC CORPORATION LIMITED, Shenzhen (CN); CHONGQING HKC OPTOELECTRONICS TECHNOLOGY CO., LTD., Chongqing (CN)

(72) Inventor: En-Tsung Cho, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

(*) Notice: Subject to any disclaimer, the term of this patent is extended or adjusted under 35 U.S.C. 154(b) by 533 days.

(21) Appl. No.: 16/461,372

(22) PCT Filed: Oct. 23, 2018

(86) PCT No.: PCT/CN2018/111461
§ 371 (c)(1),
(2) Date: May 16, 2019

(87) PCT Pub. No.: WO2020/062374
PCT Pub. Date: Apr. 2, 2020

(65) Prior Publication Data
US 2020/0272046 A1 Aug. 27, 2020

(30) Foreign Application Priority Data
Sep. 30, 2018 (CN) .......................... 201811158815.7

(51) Int. Cl.
*G03F 1/58* (2012.01)

(52) U.S. Cl.
CPC ..................................... *G03F 1/58* (2013.01)

(58) Field of Classification Search
CPC ..................................... G03F 1/32; G03F 1/58
USPC .............................................................. 430/5
See application file for complete search history.

(56) References Cited

U.S. PATENT DOCUMENTS

| 7,172,840 B2 | 2/2007 | Kanou, et al. |
| 9,964,854 B2* | 5/2018 | Xue .................... H01L 21/2652 |

FOREIGN PATENT DOCUMENTS

| CN | 104076599 A | 10/2014 |
| CN | 104810322 A | 7/2015 |
| CN | 105974728 A | 9/2016 |
| CN | 106125500 A | 11/2016 |
| CN | 106933023 A | 7/2017 |
| JP | 2013167884 A | 8/2013 |

OTHER PUBLICATIONS

Tao Hu, the ISA written comments, Jun. 2019, CN.

* cited by examiner

*Primary Examiner* — Christopher G Young

(57) ABSTRACT

This application discloses a mask and a manufacture method thereof, including: a full shielding area, made of a light shielding material; a semi-transparent area, where there is at least one semi-transparent area and the semi-transparent area allows transmission of partial light, and a main body of the semi-transparent area is made of semi-transparent films, and full shielding structures are arranged in the semi-transparent films.

20 Claims, 6 Drawing Sheets

MASK AND MANUFACTURING METHOD THEREOF

This application claims priority to Chinese Patent Application No. CN 201811158815.7, filed with the Chinese Patent Office on Sep. 30, 2018 and entitled "MASK AND MANUFACTURING METHOD THEREOF", which is incorporated herein by reference in its entirety.

TECHNICAL FIELD

The present disclosure relates to the field of display technologies, and more specifically to a mask and a manufacturing method thereof.

BACKGROUND

It should be understood that the description herein provides only background information related to the present disclosure, but does not necessarily constitute the existing technology.

With the development and advancement of science and technologies, owing to hot spots such as thin profile, power saving, and low radiation, liquid crystal (LC) displays become mainstream products of displays and are widely applied. Most existing LC displays on the market are backlight LC displays. The backlight LC display includes an LC panel and a backlight module. The working principle of the LC panel is: Liquid crystal molecules are placed between two parallel glass substrates, and a drive voltage is applied to the two glass substrates to control rotating directions of the LC molecules, so that light in the backlight module is refracted out to generate an image.

Due to performance such as low power consumption, good image quality, and a relatively high manufacturing yield rate, thin film transistor-liquid crystal displays (TFT-LCD) have gradually occupied a leading position in the display field currently. Similarly, the TFT-LCD includes an LC panel and a backlight module, the LC panel includes a color filter (CF) substrate, a thin film transistor (TFT) array substrate, and a mask, and transparent electrodes are provided on relative inner sides of the foregoing substrates. A layer of LC molecules are sandwiched between two substrates.

In a process of manufacturing a display panel, many manufacture procedures require a 4-mask process manufacture procedure. In the 4-mask process manufacture procedure, to obtain a required product, participation of a mask is required.

In the 4-mask process manufacture procedure, due to a relatively large area of a test key for measuring Amorphous Silicon (AS) remains, there are relatively few or even no remains of a photoresist in the 4-mask process manufacture procedure. As a result, the test key that should have AS remains does not have AS remains; and consequently, inline monitoring cannot be performed.

SUMMARY

In the present disclosure, to increase the film thickness of remains of a photoresist in a 4-mask process manufacture procedure, a mask and a manufacturing method thereof are provided.

To achieve the foregoing objective, the present disclosure provides a mask, comprising:

a full shielding area, made of a light shielding material; and a semi-transparent area, wherein there is at least one semi-transparent area, and the semi-transparent area allows transmission of partial light, and a main body of the semi-transparent area is made of semi-transparent films, and full shielding structures are arranged in the semi-transparent films.

Optionally, the semi-transparent area is rectangular, and the full shielding structures are stripe-shaped and are evenly arranged in the semi-transparent area.

Optionally, the full shielding structures are fret-shaped, and the full shielding structures and the semi-transparent films are staggered.

Optionally, the full shielding structures have even line widths less than or equal to exposure precision of a corresponding exposure machine.

Optionally, the line widths of the full shielding structures are greater than or equal to 0 micrometers (μm) and less than or equal to 2.5 μm, 2.5 μm herein refers to the exposure precision. However, the exposure precision is not necessarily 2.5 μm, and if the exposure precision changes, a value of 2.5 pun changes and corresponds to a value of the exposure precision.

Optionally, the semi-transparent films have even line widths greater than or equal to the exposure precision and less than or equal to half the width of the semi-transparent area.

Optionally, the line widths of the semi-transparent films are greater than or equal to 4 μm and less than or equal to 6 μm.

Optionally, the semi-transparent area is circular, the full shielding structures are ring-shaped, and the full shielding structures and the semi-transparent films are staggered.

The present disclosure further provides another mask, comprising:

a full shielding area, made of a light shielding material; and a semi-transparent area, wherein there is at least one semi-transparent area, and the semi-transparent area allows transmission of partial light, and a main body of the semi-transparent area is made of semi-transparent films and is rectangular, full shielding structures are arranged in the semi-transparent films, the full shielding structures are stripe-shaped, fret-shaped, or ring-shaped, and are evenly arranged in the semi-transparent area, and the full shielding structures and the semi-transparent films are staggered;

the full shielding structures have even line widths less than or equal to exposure precision of a corresponding exposure machine, and the semi-transparent films have even line widths greater than or equal to the exposure precision and less than or equal to half the width of the semi-transparent area; and when the exposure precision of the exposure machine is 2.5 μm, the line widths of the full shielding structures are greater than or equal to 0 μm and less than or equal to 2.5 μm, and the line widths of the semi-transparent films are greater than or equal to 4 μm and less than or equal to 6 μm.

The present disclosure further provides a manufacturing method of a mask, comprising steps of:

forming a full shielding area by using a light shielding structure;

forming, by using semi-transparent films, at least one semi-transparent area that allows transmission of partial light; and forming full shielding structures in the semi-transparent films.

Optionally, the step of forming full shielding structures in the semi-transparent films comprises:

forming stripe-shaped full shielding structures evenly arranged in the semi-transparent area and arranged at intervals with the semi-transparent films, wherein the formed stripe-shaped full shielding structures have even line widths less than or equal to exposure precision of a corresponding exposure machine; and the formed semi-transparent films have even line widths greater than or equal to the exposure precision and less than or equal to half the width of the semi-transparent area.

In a TFT manufacture procedure, if a 4-mask process manufacture procedure is adopted, generally, due to a relatively large area of a test key for measuring Amorphous Silicon (AS) remains, there are relatively few or even no photoresist remains when a light source performs photo engraving on a photoresist through a mask in the 4-mask process manufacture procedure. As a result, the test key that should have AS remains does not have AS remains; and consequently, inline monitoring cannot be performed. When the area of the semi-transparent film is greater than 10 μm×10 μm, an originally designed mask causes a case in which the thickness of the photoresist that should be remained is insufficient or the intermediate photoresist is completely exposed. However, the mask in the present disclosure includes the full shielding area made of the light shielding material and the semi-transparent area that allows transmission of partial light, and the main body of the semi-transparent area is made of the semi-transparent films; however, without any limitation to a light transmission rate of the semi-transparent film, the full shielding structures are arranged in the semi-transparent films, so that the light transmission rate of the semi-transparent film is effectively reduced in a photo engraving process. Therefore, although the light transmission rate of the semi-transparent film is excessively high, light transmitting through the semi-transparent area may also be reduced by arranging the full shielding structures, thereby increasing the film thickness of remains of the photoresist after the photo engraving process.

BRIEF DESCRIPTION OF DRAWINGS

The accompanying drawings included are used to provide a further understanding of the embodiments of the present disclosure, constitute a part of the specification, and illustrate examples of implementations of the present disclosure, and explain the principle of the present disclosure together with the text description. Apparently, the accompanying drawings in the following description show merely some embodiments of the present disclosure, and persons of ordinary skill in the art may still derive other drawings from these accompanying drawings without creative efforts. In the accompanying drawings.

DETAILED DESCRIPTION

Figure 1:
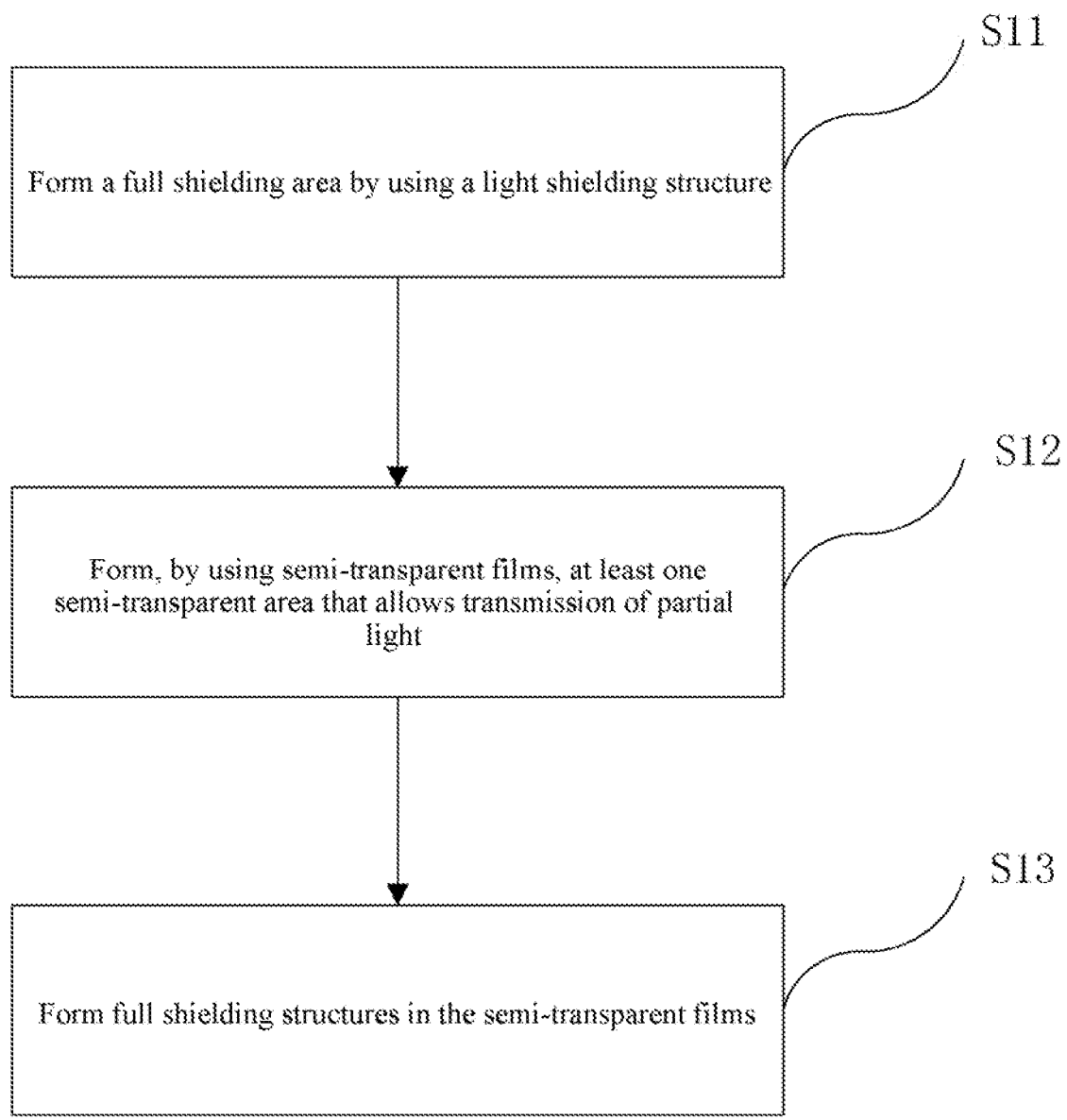
FIG. 1 is a flowchart of a manufacturing method of a mask according to an embodiment of the present disclosure.

Specific structures and functional details disclosed herein are merely representative, and are intended to describe the objectives of the exemplary embodiments of the present disclosure. However, the present disclosure may be specifically implemented in many alternative forms, and should not be construed as being limited to the embodiments set forth herein.

In the description of the present disclosure, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of the present disclosure. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly include one or more of said features. In the description of the present disclosure, unless otherwise stated, "a plurality of" means two or more than two. In addition, the terms "include", "comprise" and any variant thereof are intended to cover non-exclusive inclusion.

In the descriptions of the present disclosure, it should be noted that unless otherwise explicitly specified and defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in the present disclosure according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in the present disclosure, specify the presence of stated features, integers, steps, operations, elements, and/or components, but do not preclude the presence or addition of one or more other features, integers, steps, operations, elements, components, and/or combinations thereof.

The present disclosure is further described below with reference to the accompanying drawings and embodiments.

Figure 2:
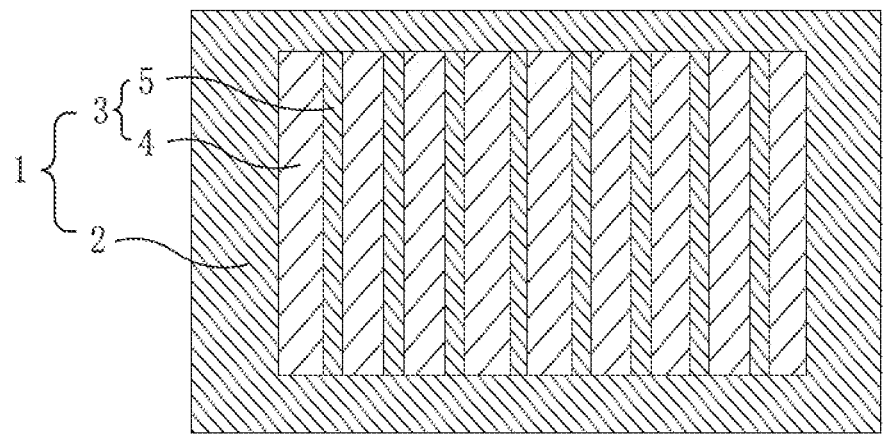
FIG. 2 is a schematic structural diagram of a mask according to an embodiment of the present disclosure.
Figure 3:
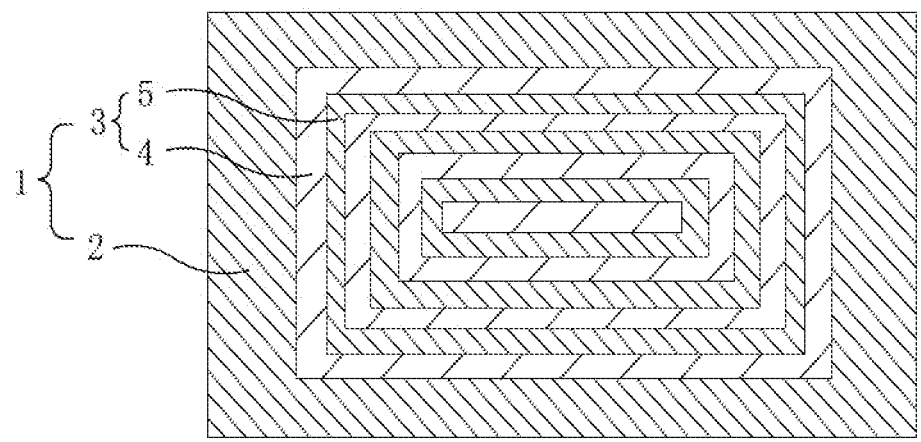
FIG. 3 is a schematic structural diagram of another mask according to an embodiment of the present disclosure.
Figure 4:
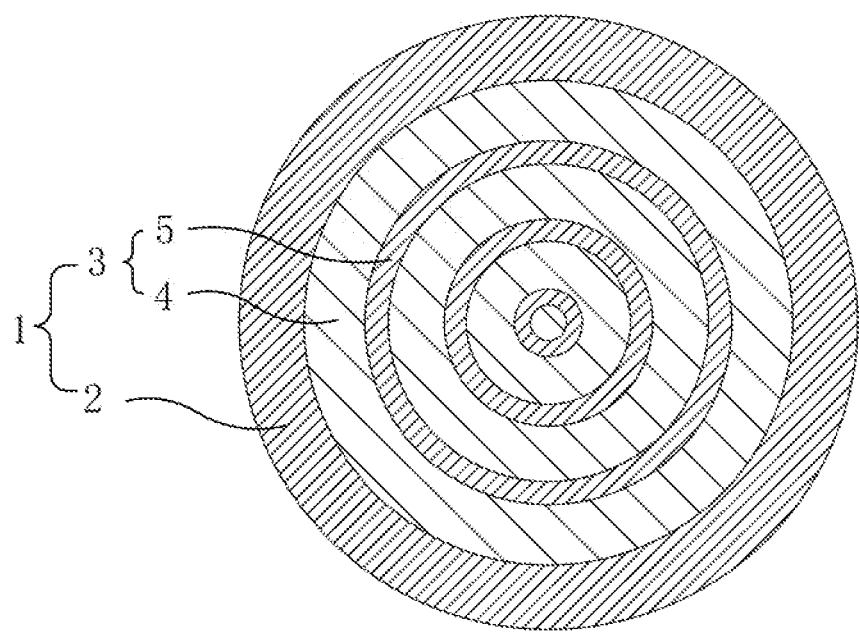
FIG. 4 is a schematic structural diagram of another mask according to an embodiment of the present disclosure.
Figure 5:
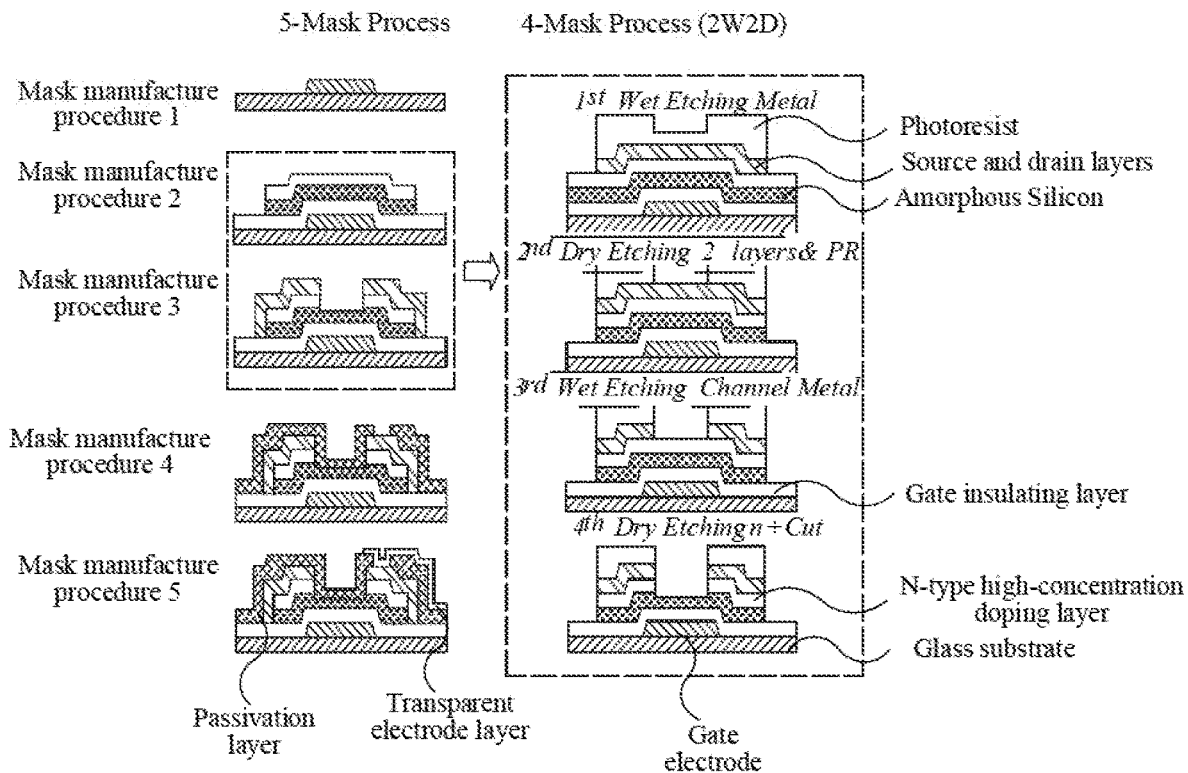
FIG. 5 is a process procedure comparison diagram according to an embodiment of the present disclosure.
Figure 6:
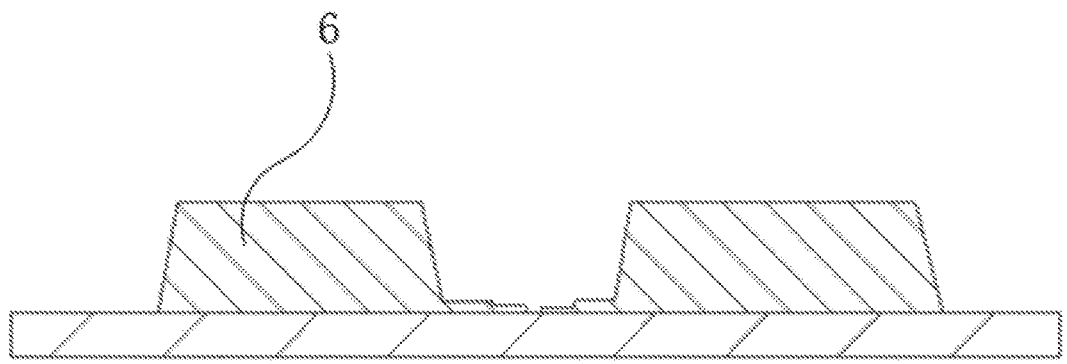
FIG. 6 is a schematic diagram of a photoresist remaining status after exposure before an embodiment of the present disclosure is performed.
Figure 7:
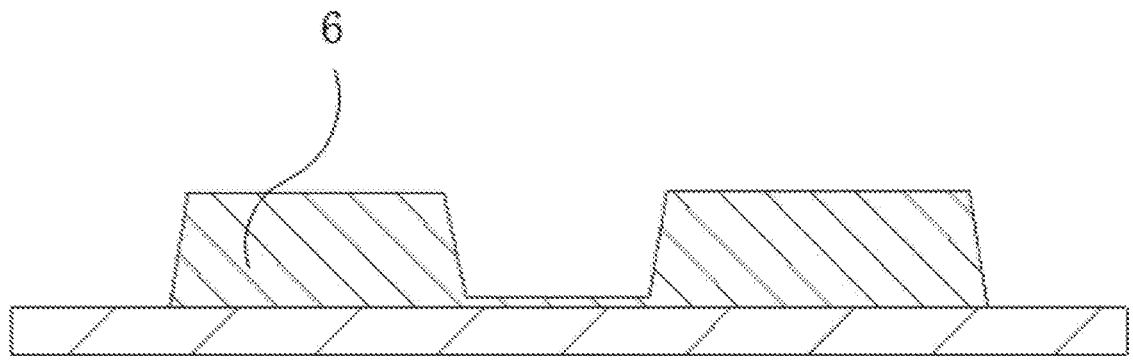
FIG. 7 is a schematic diagram of a photoresist remaining status after exposure before an embodiment of the present disclosure is performed.
Figure 8:
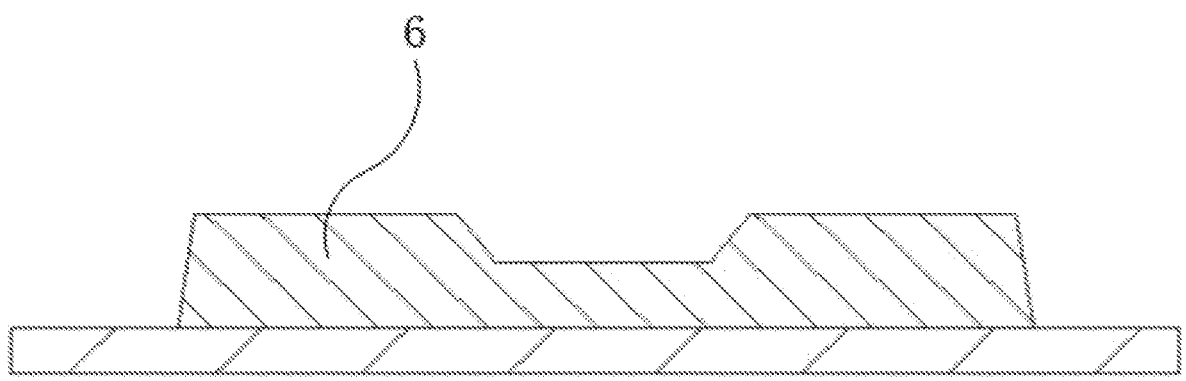
FIG. 8 is a schematic diagram of a photoresist remaining status after exposure after an embodiment of the present disclosure is performed.
Figure 9:
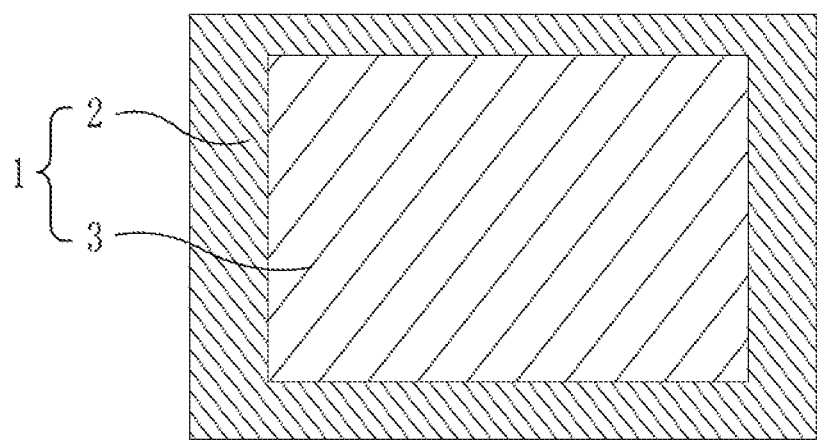
FIG. 9 is a schematic diagram of an original mask before an embodiment of the present disclosure is performed.

The present disclosure provides a mask. Referring to FIG. 2 to FIG. 8, the mask includes:

a full shielding area 2, made of a light shielding material; and a semi-transparent area 3, where there is at least one semi-transparent area, and the semi-transparent area allows transmission of partial light, and a main body of the semi-transparent area 3 is made of semi-transparent films 4, and full shielding structures 5 are arranged in the semi-transparent films 4.

In a TFT manufacture procedure, if a 4-mask process is adopted, generally, due to a relatively large area of a test key for measuring Amorphous Silicon (AS) remains, there are relatively few or even no remains of a photoresist 6 when a light source performs photo engraving on the photoresist 6 through a mask 1 in the 4-mask process. As a result, the test key that should have AS remains does not have AS remains; and consequently, inline monitoring cannot be performed. When the area of the semi-transparent film 4 is greater than 10 micrometers ($\mu$m)×10 $\mu$m, an originally designed mask causes a case in which the thickness of the photoresist 6 that should be remained is insufficient or the intermediate photoresist 6 is completely exposed. However, the mask 1 in the present disclosure includes the full shielding area 2 made of the light shielding material and the semi-transparent area 3 that allows transmission of partial light, and the main body of the semi-transparent area 3 is made of the semi-transparent films 4; however, without any limitation to a light transmission rate of the semi-transparent film 4, the full shielding structures 5 are arranged in the semi-transparent films 4, so that the light transmission rate of the semi-transparent film 4 is effectively reduced in a photo engraving process. Therefore, although the light transmission rate of the semi-transparent film 4 is excessively high, light transmitting through the semi-transparent area 3 may also be reduced by arranging the full shielding structures 5, thereby increasing the film thickness of remains of the photoresist 6 after the photo engraving process.

In this embodiment, optionally, the semi-transparent area 3 is rectangular, and the full shielding structures 5 are stripe-shaped and are evenly arranged in the semi-transparent area 3.

The stripe-shaped full shielding structures 5 are arranged in the semi-transparent area 3 of the mask 1 having a relatively large area. Based on a semi-transparent feature of the semi-transparent film 4 in the semi-transparent area 3, when a light transmission rate of the semi-transparent area 3 needs to be reduced, light shining on the photoresist 6 through the semi-transparent area 3 of the mask 1 may be reduced by using the stripe-shaped full shielding structures 5. In addition, the light transmission rate of the semi-transparent area 3 is reduced without replacing the semi-transparent film 4, so that a problem of insufficient film thickness of the remains of the photoresist 6 caused because the semi-transparent film 4 has a relatively large area is resolved. The full shielding structure 5 is set to be stripe-shaped, and a manufacturing process is simple, so that light shining on the photoresist 6 through the semi-transparent film 4 is more even, while light transmitting through the semi-transparent film 4 is reduced. Therefore, the film thickness of the photoresist 6 after the photo engraving is increased and a surface of the photoresist 6 is more flat.

In this embodiment, optionally, the full shielding structures 5 are fret-shaped, and the full shielding structures 5 and the semi-transparent films 4 are staggered.

The fret-shaped full shielding structures 5 are arranged in the semi-transparent area 3 of the mask 1 having a relatively large area. Based on a semi-transparent feature of the semi-transparent film 4 in the semi-transparent area 3, when a light transmission rate of the semi-transparent area 3 needs to be reduced, light shining on the photoresist 6 through the semi-transparent area 3 of the mask 1 may be reduced by using the fret-shaped full shielding structures 5, so that a problem of insufficient film thickness of the remains of the photoresist 6 caused because the semi-transparent film 4 has a relatively large area is resolved. The full shielding structure 5 is set to be fret-shaped, so that light shining on the photoresist 6 through the semi-transparent film 4 is more even, while light transmitting through the semi-transparent film 4 is reduced. Therefore, the film thickness of the photoresist 6 after the photo engraving is increased and a surface of the photoresist 6 is relatively flat.

In this embodiment, optionally, the full shielding structures 5 have even line widths less than or equal to exposure precision of a corresponding exposure machine.

In this solution, the line widths of the full shielding structures 5 of the semi-transparent area 3 are even and are less than or equal to the exposure precision of the corresponding exposure machine, so that by means of the full shielding structures 5, the light transmission rate of the semi-transparent area 3 is reduced, and the film thickness of the formed remains of the photoresist 6 meet the specifications after the mask 1 having a relatively large opening is used in the photo engraving process. Therefore, for the lines of the full shielding structures 5, after exposure, line-shaped protrusions corresponding to the full shielding structures 5 do not form on the surface of the photoresist 6 corresponding to the semi-transparent area 3, while the problem of insufficient film thickness of the remains of the photoresist 6 caused because the semi-transparent film 4 has a relatively large area is resolved, so that the surface of the photoresist 6 in the semi-transparent area 3 after the photo engraving process still remains flat, while the film thickness of the photoresist 6 is increased, thereby facilitating smooth execution of a subsequent manufacture procedure.

In this embodiment, optionally, the line widths of the full shielding structures 5 are greater than or equal to 0 $\mu$m and less than or equal to 2.5 $\mu$m, 2.5 $\mu$m herein refers to the exposure precision. However, the exposure precision is not necessarily 2.5 $\mu$m, and if the exposure precision changes, a value of 2.5 $\mu$m changes and corresponds to a value of the exposure precision.

Generally, the exposure precision of the exposure machine is 2.5 $\mu$m, and the line widths of the full shielding structures 5 are set to be greater than or equal to 0 $\mu$m and less than or equal to 2.5 $\mu$m, so that after the photo engraving process, the film thickness of the remains of the photoresist 6 meet the specifications, and the thickness is increased. In addition, the photo engraved photoresist 6 is relatively even without any excessively protruded part. However, by means of the full shielding structures 5, the light transmission rate of the semi-transparent area 3 is reduced, and the film thickness of the formed remains of the photoresist 6 meet the specifications after the mask 1 having a relatively large opening is used in the photo engraving process. Therefore, for the lines of the full shielding structures 5, after exposure, line-shaped protrusions corresponding to the full shielding structures 5 do not form on the surface of the photoresist 6 corresponding to the semi-transparent area 3, while the problem of insufficient film thickness of the remains of the photoresist 6 caused because the semi-transparent film 4 has a relatively large area is resolved, so that the surface of the photoresist 6 in the semi-transparent area 3 after the photo engraving process still remains flat, while the film thickness of the photoresist 6 is increased, thereby facilitating smooth execution of a subsequent manufacture procedure.

In this embodiment, optionally, the semi-transparent films 4 have even line widths greater than or equal to the exposure precision and less than or equal to half the width of the semi-transparent area 3.

The line widths of the semi-transparent films 4 are even, and the widths are greater than or equal to the exposure precision. Therefore, after the mask 1 having a relatively large opening is used in the photo engraving process, the film thickness of the formed remains of the photoresist 6 meet the specifications, and the film thickness of the remains of the photoresist 6 is increased. In addition, because the line widths of the semi-transparent films 4 are even, the photoresist 6 is more flat after the photo engraving process. When the line widths of the full shielding structures 5 are less than the exposure precision, if the line widths of the semi-transparent films 4 are also less than the exposure precision, the light transmission rate of the formed semi-transparent area 3 is very small. Therefore, a case in which the film thickness of the photoresist 6 corresponding to the semi-transparent area 3 is excessively thick may be caused, and a normal function of the mask 1 cannot be implemented, causing another problem and affecting quality of a subsequent manufacture procedure. However, if the widths of the semi-transparent films 4 are greater than half the width of the semi-transparent area 3, a decrease amplitude of the light transmission rate of the semi-transparent area 3 is excessively small. As a result, a case in which the film thickness of the remains of the photoresist 6 is excessively thin or the photoresist 6 is directly exposed still occurs; and consequently, it cannot be ensured that the film thickness of the remains of the photoresist 6 meets specifications.

In this embodiment, optionally, the line widths of the semi-transparent films 4 are greater than or equal to 4 μm and less than or equal to 6 μm.

Generally, the exposure precision of the exposure machine is 2.5 μm, when the area of the semi-transparent film 4 is greater than 10 μm×10 μm, it is proper that the line width of the semi-transparent film 4 is greater than or equal to 4 μm and less than or equal to 6 μm. If the line width of the semi-transparent film 4 is excessively large, excessive photo engraving on the photoresist 6 is caused. If the line width of the semi-transparent film 4 is excessively small, the film thickness of the photoresist 6 after the photo engraving is excessively thick. However, in this solution, the line width of the semi-transparent film 4 is greater than or equal to 4 μm and less than or equal to 6 μm, so that the line width of the semi-transparent film 4 is neither excessively large nor excessively small, thereby avoiding excessive photo engraving on the photoresist 6, and also avoiding a case in which the film thickness of the photoresist 6 after the photo engraving is excessively thick.

In this embodiment, optionally, the semi-transparent area 3 is circular, the full shielding structures 5 are ring-shaped, and the full shielding structures 5 and the semi-transparent films 4 are staggered.

The ring-shaped full shielding structures 5 are arranged in the semi-transparent area 3 of the mask 1 having a relatively large area. Based on a semi-transparent feature of the semi-transparent film 4 in the semi-transparent area 3, when a light transmission rate of the semi-transparent area 3 needs to be reduced, light shining on the photoresist 6 through the semi-transparent area 3 of the mask 1 may be reduced by using the ring-shaped fill shielding structure 5, so that a problem of insufficient film thickness of the remains of the photoresist 6 caused because the semi-transparent film 4 has a relatively large area is resolved. The full shielding structure 5 is set to be ring-shaped, and is applicable to a circular test key, so that light shining on the photoresist 6 through the semi-transparent film 4 is more even, while light transmitting through the semi-transparent film 4 is reduced. Therefore, the film thickness of the photoresist 6 after the photo engraving is increased and a surface of the photoresist 6 is relatively flat.

As shown in FIG. 2 to FIG. 8, this embodiment discloses another mask, including:

a full shielding area 2, made of a light shielding material; and a semi-transparent area 3, where there is at least one semi-transparent area, and the semi-transparent area allows transmission of partial light, and a main body of the semi-transparent area 3 is made of semi-transparent films 4 and is rectangular, full shielding structures 5 are arranged in the semi-transparent films 4, the full shielding structures 5 are stripe-shaped, fret-shaped, or ring-shaped, and are evenly arranged in the semi-transparent area 3, and the full shielding structures 5 and the semi-transparent films 4 are staggered;

the full shielding structures 5 have even line widths less than or equal to exposure precision of a corresponding exposure machine, and the semi-transparent films 4 have even line widths greater than or equal to the exposure precision and less than or equal to half the width of the semi-transparent area 3; and when the exposure precision of the exposure machine is 2.5 μm, the line widths of the full shielding structures 5 are greater than or equal to 0 μm and less than or equal to 2.5 μm, and the line widths of the semi-transparent films 4 are greater than or equal to 4 μm and less than or equal to 6 μm.

In a TFT manufacture procedure, if a 4-mask process is adopted, generally, due to a relatively large area of a test key for measuring AS remains, there are relatively few or even no remains of a photoresist 6 when a light source performs photo engraving on the photoresist 6 through a mask 1 in the 4-mask process. As a result, the test key that should have AS remains does not have AS remains; and consequently, inline monitoring cannot be performed. When the area of the semi-transparent film 4 is greater than 10 μm×10 μm, an originally designed mask causes a case in which the thickness of the photoresist 6 that should be remained is insufficient or the intermediate photoresist 6 is completely exposed. However, the mask 1 in this solution includes the full shielding area 2 made of the light shielding material and the semi-transparent area 3 that allows transmission of partial light, and the main body of the semi-transparent area 3 is made of the semi-transparent films 4; however, without any limitation to a light transmission rate of the semi-transparent film 4, the full shielding structures 5 are arranged in the semi-transparent films 4, so that the light transmission rate of the semi-transparent film 4 is effectively reduced in a photo engraving process. Therefore, although the light transmission rate of the semi-transparent film 4 is excessively high, light transmitting through the semi-transparent area 3 may also be reduced by arranging the full shielding structures 5, thereby increasing the film thickness of remains of the photoresist 6 after the photo engraving process. The stripe-shaped, fret-shaped, or ring-shaped full shielding structures 5 are arranged in the semi-transparent area 3 of the mask 1 having a relatively large area. Based on a semi-transparent feature of the semi-transparent film 4 in the semi-transparent area 3, when a light transmission rate of the semi-transparent area 3 needs to be reduced, light shining on the photoresist 6 through the semi-transparent area 3 of the mask 1 may be reduced by using the stripe-shaped, fret-shaped, or ring-shaped full shielding structures 5. In addition, the light transmission rate of the semi-transparent area 3 is reduced without replacing the semi-transparent film 4, so that a problem of insufficient film thickness of the remains of the photoresist 6 caused because the semi-transparent film 4 has a relatively large area is resolved. The full shielding structure 5 is set to be stripe-shaped, and a manufacturing process is simple, and the full shielding structure 5 is set to be stripe-shaped, fret-shaped, or ring-shaped, so that light shining on the photoresist 6 through the semi-transparent film 4 is more even, while light transmitting through the semi-transparent film 4 is reduced. Therefore, the film thickness of the photoresist 6 after the photo engraving is increased and a surface of the photoresist 6 is more flat. In this solution, the line widths of the full shielding structures 5 of the semi-transparent area 3 are even and are less than or equal to the exposure precision of the corresponding exposure machine, so that by means of the full shielding structures 5, the light transmission rate of the semi-transparent area 3 is reduced, and the film thickness of the formed remains of the photoresist 6 meet the specifications after the mask 1 having a relatively large opening is used in the photo engraving process. Therefore, for the lines of the full shielding structures 5, after exposure, line-shaped protrusions corresponding to the full shielding structures 5 do not form on the surface of the photoresist 6 corresponding to the semi-transparent area 3, while the problem of insufficient film thickness of the remains of the photoresist 6 caused because the semi-transparent film 4 has a relatively large area is resolved, so that the surface of the photoresist 6 in the semi-transparent area 3 after the photo engraving process still remains flat, while the film thickness of the photoresist 6 is increased, thereby facilitating smooth execution of a subsequent manufacture procedure. The line widths of the semi-transparent films 4 are even, and the widths are greater than or equal to the exposure precision. Therefore, after the mask 1 having a relatively large opening is used in the photo engraving process, the film thickness of the formed remains of the photoresist 6 meet the specifications, and the film thickness of the remains of the photoresist 6 is increased. In addition, because the line widths of the semi-transparent films 4 are even, the photoresist 6 is more flat after the photo engraving process. When the line widths of the fill shielding structures 5 are less than the exposure precision, if the line widths of the semi-transparent films 4 are also less than the exposure precision, the light transmission rate of the formed semi-transparent area 3 is very small. Therefore, a case in which the film thickness of the photoresist 6 corresponding to the semi-transparent area 3 is excessively thick may be caused, and a normal function of the mask 1 cannot be implemented, causing another problem and affecting quality of a subsequent manufacture procedure. However, if the widths of the semi-transparent films 4 are greater than half the width of the semi-transparent area 3, a decrease amplitude of the light transmission rate of the semi-transparent area 3 is excessively small. As a result, a case in which the film thickness of the remains of the photoresist 6 is excessively thin or the photoresist 6 is directly exposed still occurs; and consequently, it cannot be ensured that the film thickness of the remains of the photoresist 6 meets specifications. Generally, the exposure precision of the exposure machine is 2.5 μm, and the line widths of the fill shielding structures 5 are set to be greater than or equal to 0 μm and less than or equal to 2.5 μm, so that after the photo engraving process, the film thickness of the remains of the photoresist 6 meet the specifications, and the thickness is increased. In addition, the photo engraved photoresist 6 is relatively even without any excessively protruded part. However, by means of the full shielding structures 5, the light transmission rate of the semi-transparent area 3 is reduced, and the film thickness of the formed remains of the photoresist 6 meet the specifications after the mask 1 having a relatively large opening is used in the photo engraving process. Therefore, for the lines of the full shielding structures 5, after exposure, line-shaped protrusions corresponding to the full shielding structures 5 do not form on the surface of the photoresist 6 corresponding to the semi-transparent area 3, while the problem of insufficient film thickness of the remains of the photoresist 6 caused because the semi-transparent film 4 has a relatively large area is resolved, so that the surface of the photoresist 6 in the semi-transparent area 3 after the photo engraving process still remains flat, while the film thickness of the photoresist 6 is increased, thereby facilitating smooth execution of a subsequent manufacture procedure. When the area of the semi-transparent film 4 is greater than 10 μm×10 μm, it is proper that the line width of the semi-transparent film 4 is greater than or equal to 4 μm and less than or equal to 6 μm. If the line width of the semi-transparent film 4 is excessively large, excessive photo engraving on the photoresist 6 is caused. If the line width of the semi-transparent film 4 is excessively small, the film thickness of the photoresist 6 after the photo engraving is excessively thick. However, in this solution, the line width of the semi-transparent film 4 is greater than or equal to 4 μm and less than or equal to 6 μm, so that the line width of the semi-transparent film 4 is neither excessively large nor excessively small, thereby avoiding excessive photo engraving on the photoresist 6, and also avoiding a case in which the film thickness of the photoresist 6 after the photo engraving is excessively thick.

The present disclosure provides a manufacturing method of a mask. Referring to FIG. 1, FIG. 6, FIG. 7, and FIG. 8, the method includes the following steps:

S11: Form a full shielding area 2 by using a light shielding structure.

S12: Form, by using semi-transparent films 4, at least one semi-transparent area 3 that allows transmission of partial light.

S13: Form full shielding structures 5 in the semi-transparent films 4.

In a TFT manufacture procedure, if a 4-mask process is adopted, generally, due to a relatively large area of a test key for measuring AS remains, there are relatively few or even no remains of a photoresist 6 when a light source performs photo engraving on the photoresist 6 through a mask 1 in the 4-mask process. As a result, the test key that should have AS remains does not have AS remains; and consequently, inline monitoring cannot be performed. When the area of the semi-transparent film 4 is greater than 10 μm×10 μm, an originally designed mask causes a case in which the thickness of the photoresist 6 that should be remained is insufficient or the intermediate photoresist 6 is completely exposed. However, the mask 1 in the present disclosure includes the full shielding area 2 made of the light shielding material and the semi-transparent area 3 that allows transmission of partial light, and the main body of the semi-transparent area 3 is made of the semi-transparent films 4; however, without any limitation to a light transmission rate of the semi-transparent film 4, the full shielding structures 5 are arranged in the semi-transparent films 4, so that the light transmission rate of the semi-transparent film 4 is effectively reduced in a photo engraving process. Therefore, although the light transmission rate of the semi-transparent film 4 is excessively high, light transmitting through the semi-transparent area 3 may also be reduced by arranging the full shielding structures 5, thereby increasing the film thickness of remains of the photoresist 6 after the photo engraving process.

In this embodiment, optionally, step S13 of forming full shielding structures 5 in the semi-transparent films 4 includes:

forming stripe-shaped fill shielding structures 5 evenly arranged in the semi-transparent area 3 and arranged at intervals with the semi-transparent films 4, where the formed stripe-shaped full shielding structures 5 have even line widths less than or equal to exposure precision of a corresponding exposure machine; and the formed semi-transparent films 4 have even line widths greater than or equal to the exposure precision and less than or equal to half the width of the semi-transparent area 3.

The stripe-shaped full shielding structures 5 are arranged in the semi-transparent area 3 of the mask 1 having a relatively large area. Based on a semi-transparent feature of the semi-transparent film 4 in the semi-transparent area 3, when a light transmission rate of the semi-transparent area 3 needs to be reduced, light shining on the photoresist 6 through the semi-transparent area 3 of the mask 1 may be reduced by using the stripe-shaped full shielding structures 5. In addition, the light transmission rate of the semi-transparent area 3 is reduced without replacing the semi-transparent film 4, so that a problem of insufficient film thickness of the remains of the photoresist 6 caused because the semi-transparent film 4 has a relatively large area is resolved. The full shielding structure 5 is set to be stripe-shaped, and a manufacturing process is simple, so that light shining on the photoresist 6 through the semi-transparent film 4 is more even, while light transmitting through the semi-transparent film 4 is reduced. Therefore, the film thickness of the photoresist 6 after the photo engraving is increased and a surface of the photoresist 6 is more flat. In this solution, the line widths of the fill shielding structures 5 of the semi-transparent area 3 are even and are less than or equal to the exposure precision of the corresponding exposure machine, so that by means of the full shielding structures 5, the light transmission rate of the semi-transparent area 3 is reduced, and the film thickness of the formed remains of the photoresist 6 meet the specifications after the mask 1 having a relatively large opening is used in the photo engraving process. Therefore, for the lines of the full shielding structures 5, after exposure, line-shaped protrusions corresponding to the full shielding structures 5 do not form on the surface of the photoresist 6 corresponding to the semi-transparent area 3, while the problem of insufficient film thickness of the remains of the photoresist 6 caused because the semi-transparent film 4 has a relatively large area is resolved, so that the surface of the photoresist 6 in the semi-transparent area 3 after the photo engraving process still remains flat, while the film thickness of the photoresist 6 is increased, thereby facilitating smooth execution of a subsequent manufacture procedure. In this solution, the line widths of the semi-transparent films 4 are even, and the widths are greater than or equal to the exposure precision. Therefore, after the mask 1 having a relatively large opening is used in the photo engraving process, the film thickness of the formed remains of the photoresist 6 meet the specifications, and the film thickness of the remains of the photoresist 6 is increased. In addition, because the line widths of the semi-transparent films 4 are even, the photoresist 6 is more flat after the photo engraving process. When the line widths of the full shielding structures 5 are less than the exposure precision, if the line widths of the semi-transparent films 4 are also less than the exposure precision, the light transmission rate of the formed semi-transparent area 3 is very small. Therefore, a case in which the film thickness of the photoresist 6 corresponding to the semi-transparent area 3 is excessively thick may be caused, and a normal function of the mask 1 cannot be implemented, causing another problem and affecting quality of a subsequent manufacture procedure. However, if the widths of the semi-transparent films 4 are greater than half the width of the semi-transparent area 3, a decrease amplitude of the light transmission rate of the semi-transparent area 3 is excessively small. As a result, a case in which the film thickness of the remains of the photoresist 6 is excessively thin or the photoresist 6 is directly exposed still occurs; and consequently, it cannot be ensured that the film thickness of the remains of the photoresist 6 meets specifications.

The panel of the present disclosure may be a twisted nematic (TN) panel, an in-plane switching (IPS) panel, or a multi-domain vertical alignment (VA) panel, and may certainly be any other suitable type of panel.

The foregoing contents are detailed descriptions of the present disclosure in conjunction with specific embodiments, and it should not be considered that the specific implementation of the present disclosure is limited to these descriptions. Persons of ordinary skill in the art can further make simple deductions or replacements without departing from the concept of the present disclosure, and such deductions or replacements should all be considered as falling within the protection scope of the present disclosure.

What is claimed is:

1. A mask, comprising:
   a full shielding area, made of a light shielding material; and
   a semi-transparent area, wherein there is at least one semi-transparent area, and the semi-transparent area allows transmission of partial light, and
   a main body of the semi-transparent area is made of semi-transparent films, and at least one full shielding structures are arranged in the semi-transparent films;
   wherein the said full shielding area is set around the semi-transparent area, the full shielding structures are set in the semi-transparent area to reduce the light transmission of the semi-transparent area, the surface of the photoresist in the semi-transparent area after the photo engraving process still remains flat, and the thickness of a photoresist corresponding to the semi-transparent area less than the thickness of photoresist corresponding to the full shielding area.

2. The mask according to claim 1, wherein a plurality full shielding structures are arranged in the semi-transparent films, the semi-transparent area is rectangular, and the full shielding structures are stripe-shaped and are evenly arranged in the semi-transparent area.

3. The mask according to claim 1, wherein a plurality full shielding structures are arranged in the semi-transparent films,
   the semi-transparent area is rectangular, and the full shielding structures are fret-shaped.

4. The mask according to claim 1, wherein the full shielding structures have even line widths less than or equal to exposure precision of a corresponding exposure machine.

5. The mask according to claim 2, wherein the full shielding structures have even line widths less than or equal to exposure precision of a corresponding exposure machine.

6. The mask according to claim 3, wherein the full shielding structures have even line widths less than or equal to exposure precision of a corresponding exposure machine.

7. The mask according to claim 4, wherein the line widths of the full shielding structures are greater than or equal to 0 micrometers and less than or equal to 2.5 micrometers.

8. The mask according to claim 7, wherein the semi-transparent films have even line widths greater than or equal to the exposure precision and less than or equal to half the width of the semi-transparent area.

9. The mask according to claim 8, wherein the line widths of the semi-transparent films are greater than or equal to 4 micrometers and less than or equal to 6 micrometers.

10. A mask, comprising:
a full shielding area, made of a light shielding material; and
a semi-transparent area, wherein there is at least one semi-transparent area, and the semi-transparent area allows transmission of partial light, and
a main body of the semi-transparent area is made of semi-transparent films and is rectangular, full shielding structures are arranged in the semi-transparent film, the full shielding structures are stripe-shaped, fret-shaped, or ring-shaped, and are evenly arranged in the semi-transparent area, and the full shielding structures and the semi-transparent films are staggered; the full shielding structures have even line widths less than or equal to exposure precision of a corresponding exposure machine, and the semi-transparent films have even line widths greater than or equal to the exposure precision and less than or equal to half the width of the semi-transparent area; and when the exposure precision of the exposure machine is 2.5 micrometers, the line widths of the full shielding structures are greater than or equal to 0 micrometers and less than or equal to 2.5 micrometers, and the line widths of the semi-transparent films are greater than or equal to 4 micrometers and less than or equal to 6 micrometers;
wherein the said full shielding area is set around the semi-transparent area, the full shielding structures are set in the semi-transparent area to reduce the light transmission of the semi-transparent area, the surface of the photoresist in the semi-transparent area after the photo engraving process still remains flat, and the thickness of a photoresist corresponding to the semi-transparent area less than the thickness of photoresist corresponding to the full shielding area.

11. A manufacturing method of a mask, comprising steps of:
forming a full shielding area by using a light shielding structure;
forming, by using semi-transparent films, at least one semi-transparent area that allows transmission of partial light; and
forming full shielding structures in the semi-transparent films;
wherein the said full shielding area is set around the semi-transparent area, the full shielding structures are set in the semi-transparent area to reduce the light transmission of the semi-transparent area, the surface of the photoresist in the semi-transparent area after the photo engraving process still remains flat, and the thickness of a photoresist corresponding to the semi-transparent area less than the thickness of photoresist corresponding to the full shielding area.

12. The manufacturing method of a mask according to claim 11, wherein the forming full shielding structures in the semi-transparent films comprises:
forming stripe-shaped full shielding structures evenly arranged in the semi-transparent area and arranged at intervals with the semi-transparent films.

13. The manufacturing method of a mask according to claim 11, wherein the step of forming full shielding structures in the semi-transparent films comprises:
forming fret-shaped full shielding structures staggered with the semi-transparent films in the semi-transparent area.

14. The manufacturing method of a mask according to claim 11, wherein the step of forming full shielding structures in the semi-transparent films comprises:
forming the full shielding structures having even line widths less than or equal to exposure precision of a corresponding exposure machine in the semi-transparent area.

15. The manufacturing method of a mask according to claim 14, wherein the step of forming the full shielding structures having even line widths less than or equal to exposure precision of a corresponding exposure machine in the semi-transparent area comprises:
forming the full shielding structures whose line widths are greater than or equal to 0 micrometers and less than or equal to 2.5 micrometers in the semi-transparent area.

16. The manufacturing method of a mask according to claim 15, wherein the step of forming full shielding structures in the semi-transparent films comprises:
forming the semi-transparent films having even line widths greater than or equal to the exposure precision and less than or equal to the width of the semi-transparent area in the semi-transparent area.

17. The mask according to claim 1, wherein the full shielding area is circular ring, and the full shielding structures are ring-shaped.

18. The mask according to claim 1, wherein the area of the semi-transparent film 4 is greater than 10 μm×10 μm.

19. The mask according to claim 1, wherein the lines of the full shielding structures, after exposure, line-shaped protrusions corresponding to the full shielding structures do not form on the surface of the photoresist corresponding to the semi-transparent area.

20. The mask according to claim 1, wherein the thickness of a photoresist corresponding to semi-transparent films in the semi-transparent area is equal to the thickness of photoresist corresponding to the full shielding structure in the semi-transparent area.

* * * * *